(12) United States Patent
Yoshimura et al.

(10) Patent No.: US 10,553,408 B2
(45) Date of Patent: Feb. 4, 2020

(54) SUPPORTING MEMBER AND SUBSTRATE PROCESSING APPARATUS

(71) Applicant: Tokyo Electron Limited, Tokyo (JP)

(72) Inventors: Akihiro Yoshimura, Miyagi (JP); Takashi Kitazawa, Miyagi (JP); Yasushi Masuda, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/326,614

(22) Filed: Jul. 9, 2014

(65) Prior Publication Data

US 2015/0013938 A1    Jan. 15, 2015

(30) Foreign Application Priority Data

Jul. 12, 2013    (JP) .................................. 2013-146571

(51) Int. Cl.
*H01J 37/32*    (2006.01)

(52) U.S. Cl.
CPC .............................. *H01J 37/32715* (2013.01)

(58) Field of Classification Search
CPC ..... H01L 21/67109; H01L 2224/48227; H01L 2224/48228; F28D 15/0275; F28D 15/08; F28F 2275/08
See application file for complete search history.

(56) References Cited

U.S. PATENT DOCUMENTS

| | | | | |
|---|---|---|---|---|
| 3,741,886 | A | * | 6/1973 | Urbanek et al. ......... C23C 14/35 204/298.12 |
| 5,660,165 | A | * | 8/1997 | Lannes ............... F24D 17/0068 122/14.2 |
| 6,374,769 | B1 | * | 4/2002 | Pesavento ............. B41F 31/002 101/487 |
| 2003/0159307 | A1 | * | 8/2003 | Sago ................. H01L 21/67109 34/107 |
| 2003/0192686 | A1 | * | 10/2003 | Hisai ....................... F28D 15/02 165/201 |
| 2005/0067038 | A1 | | 3/2005 | Kobayashi et al. |
| 2006/0005930 | A1 | * | 1/2006 | Ikeda ................ H01J 37/32431 156/345.51 |
| 2006/0207725 | A1 | * | 9/2006 | Oohashi ............ H01J 37/32724 156/345.53 |
| 2007/0145691 | A1 | | 6/2007 | Katsura |
| 2009/0110824 | A1 | | 4/2009 | Takenaga et al. |
| 2010/0326957 | A1 | * | 12/2010 | Maeda .................... H01J 37/20 216/67 |
| 2011/0079367 | A1 | | 4/2011 | Sasaki |
| 2011/0253190 | A1 | | 10/2011 | Farnham, Jr. |

(Continued)

FOREIGN PATENT DOCUMENTS

| | | |
|---|---|---|
| CN | 100411096 | 8/2008 |
| CN | 202629482 U | 12/2012 |

(Continued)

*Primary Examiner* — Tho V Duong
(74) *Attorney, Agent, or Firm* — IPUSA, PLLC

(57) ABSTRACT

A supporting member is configured to support at least one pipe connecting a temperature adjusting unit with a substrate processing apparatus, wherein the temperature adjusting unit adjusts a temperature of an arbitrary component of the substrate processing apparatus, wherein an inside of the supporting member includes a hollow portion and the at least one pipe is arranged in the hollow portion.

5 Claims, 3 Drawing Sheets

(56) References Cited

U.S. PATENT DOCUMENTS

| | | | |
|---|---|---|---|
| 2011/0317366 A1* | 12/2011 | Fukutani | H01L 25/072 361/699 |
| 2012/0211213 A1* | 8/2012 | Kitajima | H01L 23/473 165/185 |
| 2012/0222818 A1* | 9/2012 | Sakata | H01L 21/67109 156/345.53 |
| 2012/0227955 A1* | 9/2012 | Koshimizu | G05D 23/1919 165/281 |
| 2014/0311728 A1 | 10/2014 | Nonaka | |

FOREIGN PATENT DOCUMENTS

| | | |
|---|---|---|
| CN | 202753761 U | 2/2013 |
| JP | H05-050274 U | 7/1993 |
| JP | 3037425 U | 5/1997 |
| JP | H10-303168 | 11/1998 |
| JP | 2004-197876 | 7/2004 |
| JP | 2004-311640 | 11/2004 |
| JP | 2006-339555 | 12/2006 |
| JP | 2008-196692 | 8/2008 |
| JP | 2013-026387 | 2/2013 |
| JP | 2013-514669 | 4/2013 |
| TW | 200525107 | 8/2005 |
| TW | 200943452 | 10/2009 |
| TW | 201131642 | 9/2011 |
| TW | 201318062 | 5/2013 |
| WO | 2011/075437 | 6/2011 |

* cited by examiner

SUPPORTING MEMBER AND SUBSTRATE PROCESSING APPARATUS

CROSS-REFERENCE TO RELATED APPLICATIONS

This patent application is based upon and claims the benefit of priority of Japanese Patent Application No. 2013-146571 filed on Jul. 12, 2013, the entire contents of which are incorporated herein by reference.

BACKGROUND OF THE INVENTION

1. Field of the Invention

The present invention generally relates to a supporting member and a substrate processing apparatus.

2. Description of the Related Art

An example of a substrate processing apparatus is a plasma processing apparatus that provides a predetermined process such as etching to a substrate such as a wafer for a semiconductor device using plasma.

For example, the plasma processing apparatus includes a treatment container, inside of which plasma is generated, upper and lower electrode provided opposite to each other, and a gas supply portion for supplying a process gas to a space sandwiched between the upper and lower electrodes through the gas supply port. A high frequency power is applied to at least any one of the upper and lower electrodes provided opposite to each other to excite a process gas by the electric field energy. A plasma process is applied to a substrate by generated discharge plasma.

The temperature of the upper electrode is controlled by using a chiller unit so that a cooling or heating medium having a predetermined temperature is circulated and supplied through a pipe. For example, in a case where the temperature of the upper electrode is controlled to be 150° C., the heating medium heated at a temperature of 150° C. is circulated and supplied.

SUMMARY OF THE INVENTION

Because a pipe has a temperature depending on a supplied heating medium, the pipe is insulated by winding a heat insulator around the pipe to secure safety of a touch by a person. However, there is a problem in view of a footprint because a great space is occupied by the heat insulator and the pipe.

Accordingly, embodiments of the present invention may provide a novel and useful supporting member solving one or more of the problems discussed above.

More specifically, the embodiments of the present invention may provide a novel and useful supporting member, which enables heat insulation of the pipe and a smaller footprint of the pipe.

According to an aspect of the present invention, there is provided a supporting member that is configured to support at least one pipe connecting a temperature adjusting unit with a substrate processing apparatus, wherein the temperature adjusting unit adjusts a temperature of an arbitrary component of the substrate processing apparatus, wherein an inside of the supporting member includes a hollow portion and the at least one pipe is arranged in the hollow portion.

Additional objects and advantages of the embodiments are set forth in part in the description which follows, and in part will become obvious from the description, or may be learned by practice of the invention. The objects and advantages of the invention will be realized and attained by means of, the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

A description is given below, with reference to the FIG. 1 through FIG. 6 of embodiments of the present invention. Where the same reference symbols are attached to the same parts, repeated description of the parts is omitted.

Within the embodiment, a substrate processing apparatus is exemplified as a plasma processing apparatus that provides plasma process to a wafer using plasma. However, the present invention is not limited to this point and may be applied to any substrate processing apparatus, which is connected with a temperature adjusting unit (e.g., a chiller unit) through a pipe (e.g., a chiller hose). Specifically, the substrate processing apparatus may be a vertical substrate processing apparatus that performs various processes such as a film deposition process, an oxidation process, a diffusion process, a reformulation process, a naturally oxidized film removal process, or the like.

Reference symbols typically designate as follows:
1: substrate processing apparatus;
2: mounting stage;
3: upper electrode;
4: gas supply source;
5: first high frequency power source;
6: second high frequency power source;
7: heating medium pipe;
8: chiller hose;
9: chiller hose;
10: chiller unit;
11: control unit;
20: heat insulator; and
C: chamber.
W: wafer

[Schematic Structure of Substrate Processing Apparatus]

Figure 1:
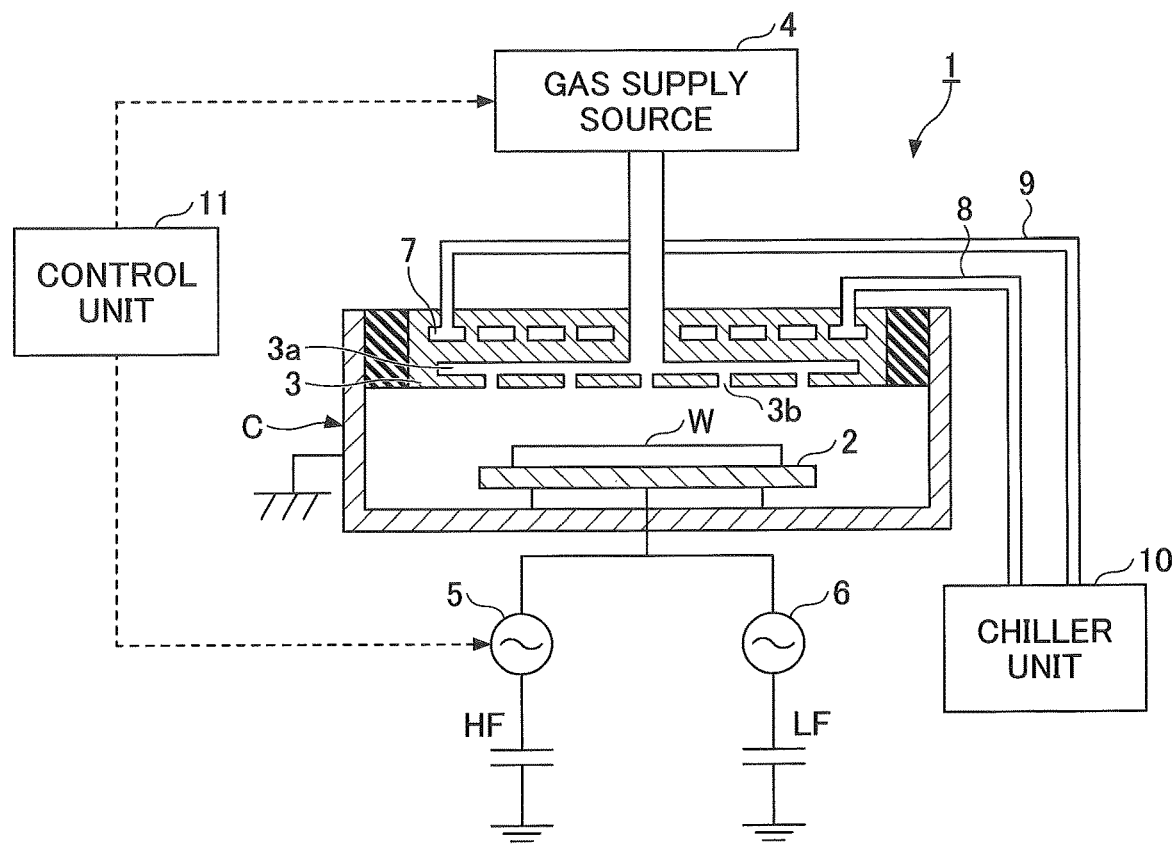
FIG. 1 is a longitudinal cross-sectional view of a substrate processing apparatus of an embodiment of the present invention.

At first, the structure of the substrate processing apparatus of an embodiment is described with reference to FIG. 1. FIG. 1 is a longitudinal (vertical) cross-sectional view of a substrate processing apparatus of the embodiment of the present invention.

The substrate processing apparatus 1 includes a metallic cylindrical chamber (hereinafter, referred to as a "chamber"

C") made of, for example, aluminum or stainless steel. The chamber C is electrically grounded. Inside the chamber C, a plasma process is provided to a semiconductor wafer (hereinafter, referred so as a "wafer W").

A mounting stage 2 for mounting the wafer W is provided inside the chamber C. The mounting stage 2 functions also as a lower electrode.

An upper electrode 3 is provided on a ceiling portion of the chamber C so as to be arranged opposite to the mounting stage 2. A gas supply source 4 is connected to the upper electrode 3. A diffusion chamber 3a is formed inside the upper electrode 3 to diffuse a gas supplied from a gas supply source 4. The gas inside the diffusion chamber 3a is introduced into the chamber C after passing through many gas ports 3b formed in a bottom portion of the upper electrode 3. The upper electrode 3 functions as a shower head for supplying the gas.

The substrate processing apparatus 1 includes a high frequency power source 5 and a second high frequency power source 6. High frequency power for generating plasma output from the first high frequency power source 5 is applied to any one of the mounting stage 2 (the lower electrode) or the upper electrode 3. In the example illustrated in FIG. 1, the high frequency power supplied from the first high frequency power source 5 is applied to the lower electrode.

High frequency power output from the second high frequency power source 6 for biasing is applied to the mounting stage 2.

The gas introduced into the chamber C is changed to plasma by the frequency power. With this, a plasma process is provided to the wafer W inside the chamber C.

Inside the upper electrode 3, a heating medium pipe 7 is ordinarily provided. A heating medium having a predetermined temperature is circulated and supplied by a chiller unit 10 through chiller hoses 8 and 9 being a pipe. The process temperature of the upper electrode 3 is adjusted to have a predetermined temperature by heating or cooling by the chiller unit 10.

The chiller unit 10 is generally provided near the bottom portion of the substrate processing apparatus 1. Further, the chiller hoses 8 and 9 extend upward at least in the height direction of the substrate processing apparatus 1 and are connected with the heating medium pipe 7.

In the substrate processing apparatus 1, a plasma process is performed in accordance with the control of the control unit 11. The control unit 11 includes a central processing unit (CPU), a read only memory (ROM), a random access memory (RAM), and so on. The CPU performs the plasma process in accordance with various recipes stored in a memory area such as a ROM. In the recipe, control information of process conditions in the apparatus such as a process time, a temperature inside the treatment chamber (an upper electrode temperature, a side wall temperature of the treatment chamber, an ESC temperature, etc.), a pressure (an exhaust gas), high frequency power, a voltage, various process flow rates, a heat transfer rate, or the like.

A schematic structure of the substrate processing apparatus 1 of the embodiment has been described above. Next, problems related to chiller hoses 8 and 9 of the substrate processing apparatus 1 are described.

(Problems Related to the Chiller Hoses 8 and 9)

As described, the heating medium pipe 7 is provided inside the upper electrode 3. A heating medium having a predetermined temperature is circulated through and supplied to the heating medium pipe 7 from the chiller unit 10 through chiller hoses 8 and 9. For example, in a case where the temperature of the upper electrode is controlled to be 150° C., the heating medium heated at a temperature of 150° C. is circulated through and supplied to the heating medium pipe 7. At this time, the chiller hoses 8 and 9 are heated by the heating medium so as to have a high temperature. Therefore, a heat insulator is ordinarily wound around the chiller hoses 8 and 9 so as to be insulated.

Figure 2:
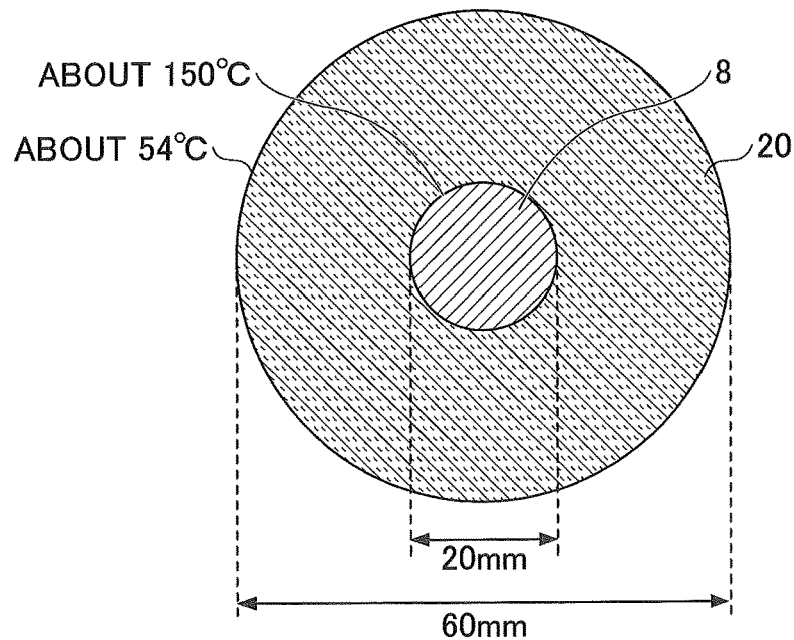
FIG. 2 schematically illustrates a chiller hose, around which a heat insulator wound.

FIG. 2 schematically illustrates a chiller hose, around which the heat insulator wound.

For example, described below is a case where the outer diameter of the chiller hose 8, inside which a heating medium flows, is 20 mm, a heat insulator 20 is made of a silicon sponge sheet having the coefficient $\lambda_1$ of thermal conductivity of $5.0 \times 10^{-2}$ W/m·k and is uniformly wrapped around, and the outside air temperature is 25° C.

In this case, if the outer diameter of a structure including the chiller hose 8 and the heat insulator 20 is 60 mm as illustrated in FIG. 2 (i.e., a case where the heat insulator having a thickness of 20 mm is wound), the surface temperature of the heat insulator 20 becomes 54° C.

For a reason of security, the temperature of a portion where a person can easily touch is preferably equal to or less than 60° C., more preferably equal to 50° C. or less. Therefore, as the embodiment illustrated in FIG. 2, after winding the heat insulator 20 having the thickness of about 20 mm around the chiller hoses 8 or 9 as in the embodiment illustrated in FIG. 2, the chiller hose 8 has a temperature enabling a safe touch by a person. However, because the thickness of the heat insulator 20 is as great as about 20 mm, there is a problem in view of the footprint.

Therefore, the present invention is provided to solve the problems that are adversely affecting both of heat insulation of the chiller hoses 8 and 9 and a small footprint of the chiller hoses 8 and 9 by improving a supporting member (described below), which is a supporting frame for ordinarily supporting components of the substrate processing apparatus 1, so as to arrange the chillers hoses 8 and 9 inside the supporting member.

Hereinafter, an exemplary supporting member and the supporting member of the embodiment are described in detail. In the following description, the outer diameter of the chiller hose and the outer peripheral dimension of a cross-sectional view of the supporting member are unified in order to compare the exemplary supporting member and the supporting member of the embodiment. Specifically, within both the exemplary supporting member and the supporting member of the embodiment, the outer diameter of the chiller hose is 20 mm, the outer peripheral dimension of the cross-sectional view of the supporting member is 90 mm×45 mm in (the distance along the x axis)×(the distance along the y axis) in FIGS. 3 to 6. However, the present invention is not limited thereto.

(Supporting Member of First Embodiment)

Figure 3:
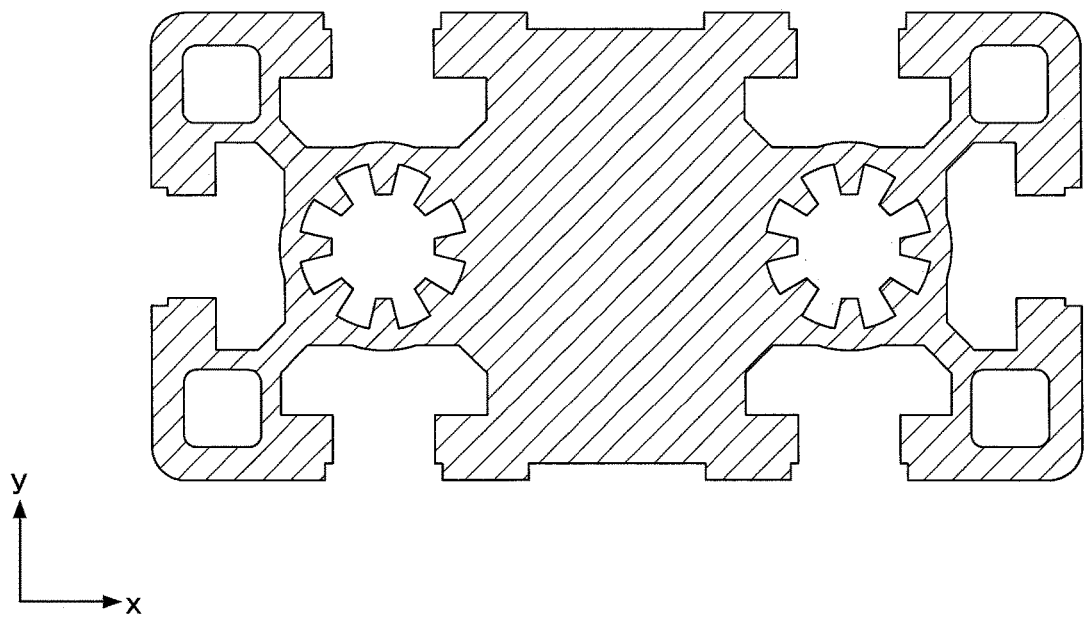
FIG. 3 is a cross-sectional view schematically illustrating an exemplary supporting member.

At first, the exemplary supporting member is described. FIG. 3 is a cross-sectional view schematically illustrating the exemplary supporting member.

A high strength and a light weight are the properties required for the supporting member 30. Therefore, the exemplary supporting member 30 is made of aluminum or an aluminum alloy, each of which is relatively cheap and has high strength. However, the exemplary supporting member 30 illustrated in FIG. 3 is not provided with a space arranging the chiller hose, for example, a hollow portion. Said differently, the chiller hose in a bare state is arranged. Therefore, there is a problem that a person may directly touch the chiller hose having a high or low temperature.

[First Embodiment]

Figure 4:
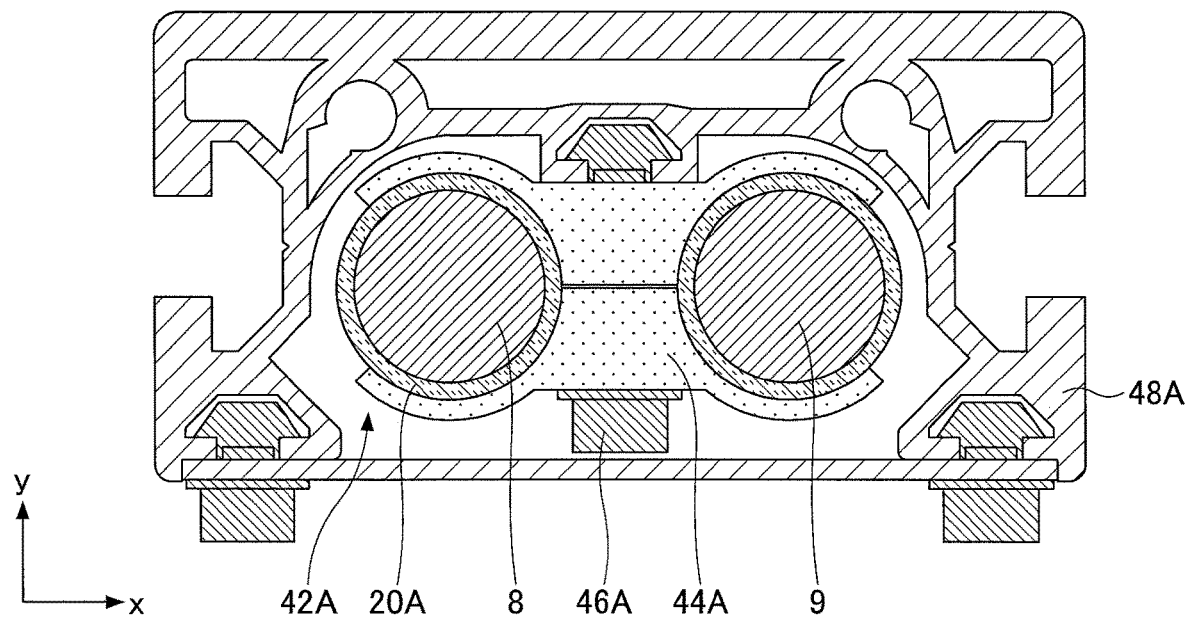
FIG. 4 is a cross-sectional view schematically illustrating a supporting member of a first embodiment of the present invention.

Next, the supporting member of a first embodiment is described. FIG. 4 is a cross-sectional view schematically illustrating a supporting member of the first embodiment of the present invention.

The supporting member 40A of the first embodiment illustrated in FIG. 4 includes a frame 48A forming the housing of the supporting member 40A.

The frame 48A includes a hollow portion 42A accommodating chiller hoses 8 and 9, a heat insulator 20A (described below), and a pipe clamp 44A (described below).

The heat insulators 20A contact the outer surfaces of the chiller hoses 8 and 9. Within the first embodiment, the thickness of the heat insulator 20A is preferably about 1 mm to 4 mm.

The heat insulator 20 may be appropriately made of heat insulating material as long as it has heat resistance withstanding the temperature of the heating medium. A specific material of the heat insulator 20 is a polyimide resin, a polyether-ether-ketone resin, a fluorine resin, aramid fiber, silicon sponge, Aeroflex ("Aeroflex" is a registered trademark), or the like.

A pipe clamp 44A supporting at least a part of the outer periphery of the heat insulator 20A is arranged on the outer peripheral side of the heat insulator 20A. Further, a fixed portion 46A for fixing the pipe clamp 44A is provided in the frame 48A of the supporting member 40A on the outer peripheral side of the pipe clamp 44A.

By using the pipe clamp 44A, the chiller hoses 8 and 9 do not directly contact the frame 48A. Therefore, the outer surface temperature of the frame 48A can be easily made a temperature enabling a person to safely touch the frame 48A. Within the first embodiment, the pipe clamp 44A is made of polypropylene.

The fixed portion 46A is not specifically limited as long as the chiller hoses 8 and 9 arranged inside the hollow portion 42A are fixed to the frame 48A. Within the first embodiment, the chiller hoses 8 and 9 are fixed to the frame 48A using screws made of stainless steel.

The material of the frame 48A is not specifically limited and is preferably aluminum or an aluminum alloy, each of which is relatively low in cost and high in strength.

In the supporting member 40A of the first embodiment, the chiller hoses 8 and 9 are arranged inside the hollow portion 42 of the supporting member 40A. Further, because the chiller hoses 8 and 9 do not directly contact the frame 48A, the outer surface temperature of the frame 48A can be easily made a temperature safely enabling a person to touch, for example, a temperature equal to or smaller than 60° C.

In a case where the exemplary supporting member 30 is used, occupied areas of the chiller hoses 8 and 9 are required in addition to an occupied area of the supporting member 30. However, by using the supporting member 40A of the first embodiment, the chiller hoses 8 and 9 are arranged inside the frame 48A. Therefore, the space can be saved (the smaller footprint can be achieved).

Effects of the supporting member 40A of the first embodiment are described.

The heat insulator 20A made of foamed polyimide having a coefficient of thermal conductivity $\lambda$:0.044 (W/m·K) was wound to have a thickness of 2 mm around the outer surfaces of the chiller hoses 8 and 9, which were previously set to be 150° C. Then, the chiller hoses 8 and 9 wound by the foamed polyimide were fixed to each other by the pipe cramp 44A. Further, the chiller hoses 8 and 9 wound by the heat insulator 20A and fixed each other by the pipe cramp 44A were fixed to the supporting member 40A by screws.

In this state, the outer surface temperature of the outer surface of the frame 48A of the supporting member 40A was monitored. As a result, the temperature of the outer surface of the frame 48A was constantly 48.1° C. Said differently, by using the supporting member 40A of the first embodiment, the chiller hoses 8 and 9 can be retained inside the supporting member 40A, and simultaneously the outer surface temperature of the supporting member 40A can have a temperature enabling a person to safely touch the outer surface of the supporting member 40A.

The moment of inertia of area (the cross-sectional area second-order moment) of the supporting member 40A in the x-axis direction in FIG. 4 is about 166 mm$^4$ and the moment of inertia of area (the cross-sectional area second-order moment) of the supporting member 40A in the y-axis direction in FIG. 4 is about 35 mm$^4$. The moment of inertia of area (the cross-sectional area second-order moment) of the exemplary supporting member 30 in the x-axis direction in FIG. 3 is about 129 mm$^4$ and the moment of inertia of area (the cross-sectional area second-order moment) of the supporting member 30 in the y-axis direction in FIG. 3 is about 33 mm$^4$. Said differently, the supporting member 40A of the first embodiment has a sufficient strength in comparison with the exemplary supporting member 30.

[Second Embodiment]

Figure 5:
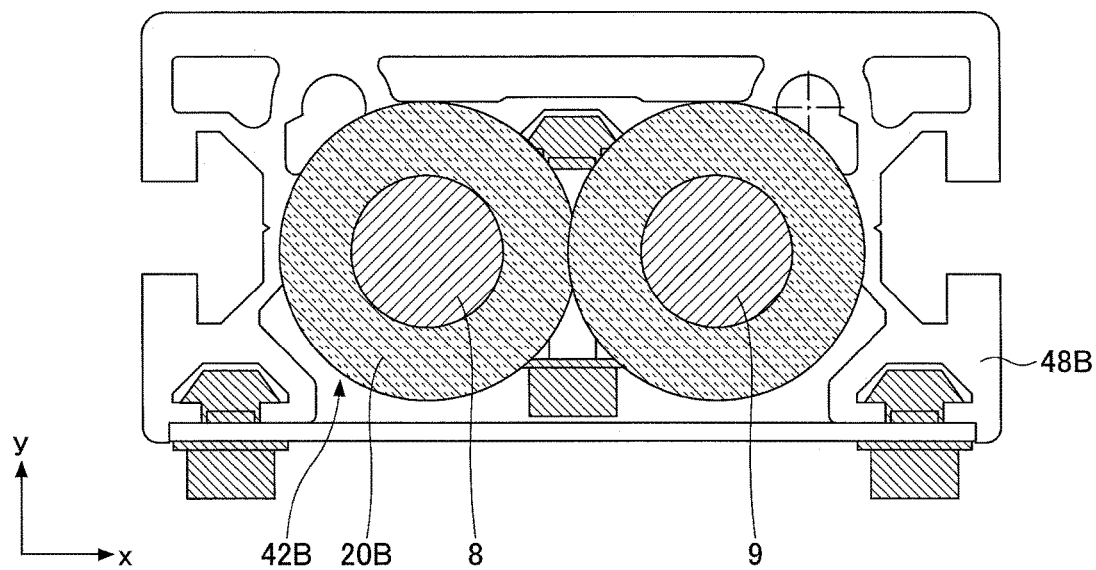
FIG. 5 is a cross-sectional view schematically illustrating a supporting member of a second embodiment of the present invention.

FIG. 5 is a cross-sectional view schematically illustrating a supporting member of the second embodiment of the present invention.

The supporting member 40B of the second embodiment illustrated in FIG. 5 includes a frame 48B forming the housing of the supporting member 40B.

In a manner similar to the first embodiment, the frame 48B includes a hollow portion 42B. The second embodiment differs from the first embodiment at points that only the chiller hoses 8 and 9 and a heat insulator 20B are arranged inside the hollow portion 42B. Within the second embodiment, the heat insulator 20B contacts the outer surfaces of the chiller hoses 8 and 9, and the outer surface of the heat insulator 20B contacts the frame 48B.

The heat insulator 20B may be appropriately made of known heat insulating material as long as it has heat resistance withstanding the temperature of the heating medium. A specific material of the heat insulator 20 is a polyimide resin, a polyether-ether-ketone resin, a fluorine resin, aramid fiber, silicon sponge, Aeroflex ("Aeroflex" is a registered trademark), or the like.

The material of the frame 48B is not specifically limited and is preferably aluminum or an aluminum alloy, each of which is relatively low in cost and high in strength.

In a manner similar to the first supporting member 40A, the chiller hoses 8 and 9 of the second embodiment are arranged inside the hollow portion 42B of the supporting member 40B. Therefore, a person is prevented from directly touching the chiller hoses 8 and 9, which become to have a high or low temperature by the heating medium.

Further, in the supporting member 40B of the second embodiment, the heat insulator 20B directly contacts the frame 48B. However, it is unnecessary to use the pipe clamp 44A, which is a component of the supporting member 40A of the first embodiment. Therefore, the heat insulator 20B can be made thicker than the heat insulator 20A of the first embodiment. With this, the outer surface temperature of the frame 48B can be made a temperature enabling a person safely touch the outer surface of the frame 48A.

However, by using the supporting member 40B of the second embodiment, the chiller hoses 8 and 9 are arranged inside the frame 48B. Therefore, the space can be saved (the smaller footprint can be achieved).

Effects of the supporting member 40B of the second embodiment are described.

The heat insulator 20B made of silicon sponge having a coefficient of thermal conductivity λ:0.08 (W/m·K) or Aeroflex having a coefficient of thermal conductivity λ:0.034 (W/m·K) was wound to have a thickness of 7 mm around the outer surfaces of the chiller hoses 8 and 9, which were set to be 150° C. Then, the chiller hoses 8 and 9 wound by the heat insulator 20B were fixed to the frame 48B by directly making the heat insulator 20B contact the frame 48B. In this state, the temperature of the outer surface of the frame 48B of the supporting member 40B was monitored. As a result, the temperature of the outer surface of the frame 48B constantly became 59.0° C. for the silicon sponge and 46.8° C. for the Aeroflex. Said differently, by using the supporting member 40B of the second embodiment, the chiller hoses 8 and 9 can be retained inside the supporting member 40B, and simultaneously the outer surface temperature of the supporting member 40B can have a temperature enabling a person to safely touch the outer surface of the supporting member 40B.

Further, the supporting member 40B has the moment of inertia of area (the cross-sectional area second-order moment) in a manner similar to the supporting member 40A of the first embodiment. Said differently, the supporting member 40B of the second embodiment has a sufficient strength in comparison with the exemplary supporting member 30.

[Third Embodiment]

Figure 6:
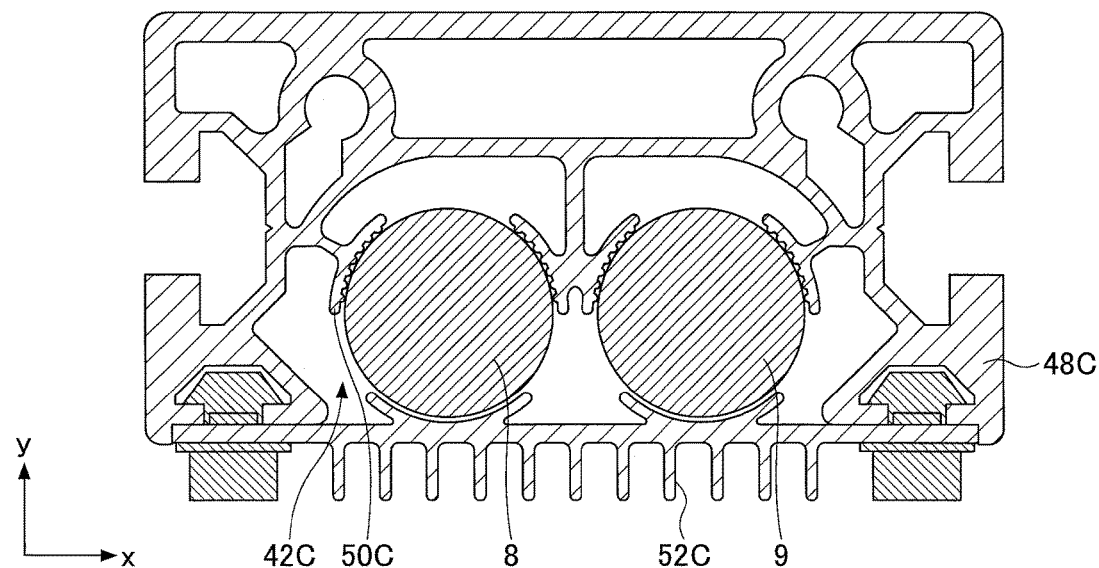
FIG. 6 is a cross-sectional view schematically illustrating a supporting member of a third embodiment of the present invention.

FIG. 6 is a cross-sectional view schematically illustrating a supporting member of the third embodiment of the present invention.

The supporting member 40C of the third embodiment illustrated in FIG. 6 includes a frame 48C forming the housing of the supporting member 40C.

In a manner similar to the first and second embodiments, the frame 48C includes a hollow portion 42C. The third embodiment differs from the first and second embodiments at points that only the chiller hoses 8 and 9 are arranged inside the hollow portion 42C, and the chiller hosed 8 and 9 are directly fixed to the frame 48C by a fixed portion 50C, which is a part of the frame 48C, without using the heat insulator.

Within the third embodiment, the chiller hoses 8 and 9 directly contact the frame 48C through the fixed portion 50. Therefore, a heat sink portion 52C for cooling the frame 48C is provided in order to prevent the frame 48C from being heated at a temperature not enabling a person safely touch the frame 48C.

The heat sink portion 52C can be formed by shaping at least a part of the frame 48C to be like a pin holder (densely arranged needles) or bellows (densely arranged fins).

The fixed portion 50C contacts at least a part of the outer surfaces of the chiller hoses 8 and 9. It is preferable that a protrusion, for example, is provided on a side of each fixed portion to be contact with the chiller hoses 8 and 9 in order to reduce a contact area between the fixed portion 50C and the chiller hose 8 or 9.

The material of the frame 48C is not specifically limited and is preferably aluminum or an aluminum alloy, each of which is relatively low in cost and high in strength.

In a manner similar to the first and second supporting members 40A and 40B, the chiller hoses 8 and 9 of the third embodiment is arranged inside the hollow portion 42C of the supporting member 40C. Therefore, a person is prevented from directly touching the chiller hoses 8 and 9, which become to have a high or low temperature by the heating medium.

Further, in the supporting member 40C of the third embodiment, the fixed portion 50C directly contacts the frame 48C. However, because the supporting member 40C has the heat sink portion 52C, the frame 48C can be cooled. With this, the outer surface temperature of the frame 48C can be made a temperature enabling a person safely touch the outer surface of the frame 48C.

Further, by using the supporting member 40C of the third embodiment, the chiller hoses 8 and 9 are arranged inside the frame 48C. Therefore, the space can be saved (the smaller footprint can be achieved).

The moment of inertia of area (the cross-sectional area second-order moment) of the supporting member 40C in the x-axis direction in FIG. 6 is about 160 mm$^4$ and the moment of inertia of area (the cross-sectional area second-order moment) of the supporting member 40C in the y-axis direction in FIG. 6 is about 36 mm$^4$. The moment of inertia of area (the cross-sectional area second-order moment) of the exemplary supporting member 30 in the x-axis direction in FIG. 3 is about 129 mm$^4$ and the moment of inertia of area (the cross-sectional area second-order moment) of the exemplary supporting member 30 in the y-axis direction in FIG. 3 is about 33 mm$^4$. Said differently, the supporting member 40C of the third embodiment has a sufficient strength in comparison with the exemplary supporting member 30.

Within the embodiments, the chiller hoses 8 and 9 are arranged in the hollow portions 42A to 42C, which are formed in the supporting members 40A to 40C. However, the present invention is not limited to the points. For example, a cable member such as a various electric cable of the substrate processing apparatus may be provided instead of the chiller hose.

According to the embodiment, it is possible to provide the supporting member satisfying both of heat insulation of the pipe and a smaller footprint of the pipe.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the supporting member have been described in detail, it should be understood that the various changes, substitutions, and alterations could be made hereto without departing from the spirit and scope of the invention.

What is claimed is:

1. A supporting member that is configured to support a semiconductor substrate processing apparatus, the supporting member comprising:
   a frame, in an inside of which a hollow portion is included; and
   a pipe clamp configured to hold at least two pipes and extending along a longitudinal direction of the at least two pipes, the at least two pipes being configured to circulate a heating medium, the at least two pipes extending upward in a height direction of the semiconductor substrate processing apparatus and being positioned in the hollow portion; and
   a fixing member configured to fix the pipe clamp to the frame,
   wherein outer surfaces of the at least two pipes are covered by a heat insulator, and wherein at least a part of an outer surface of the heat insulator is supported by the pipe clamp.

2. The supporting member according to claim 1, wherein the heat insulator includes at least one material selected from a group of a polyimide resin, a polyether-ether-ketone resin, a fluorine resin, aramid fiber, silicon sponge, and Aeroflex.

3. The supporting member according to claim 1, wherein a temperature of an outer surface of the supporting member is equal to or smaller than 60° C. in a case where a heating medium having a temperature of 150° C. is introduced inside the at least two pipes.

4. The supporting member according to claim 1, wherein the at least two pipes are positioned in the hollow portion so as not to directly contact the frame.

5. The supporting member according to claim 1, wherein a thickness of the heat insulator is equal to or greater than 1 mm and equal to or smaller than 4 mm.

\* \* \* \* \*